United States Patent
Takagi

(10) Patent No.: US 10,396,302 B2
(45) Date of Patent: Aug. 27, 2019

(54) ORGANIC ELECTROLUMINESCENCE DISPLAY DEVICE

(71) Applicant: Japan Display Inc., Tokyo (JP)

(72) Inventor: Jun Takagi, Tokyo (JP)

(73) Assignee: Japan Display Inc., Tokyo (JP)

(\*) Notice: Subject to any disclaimer, the term of this patent is extended or adjusted under 35 U.S.C. 154(b) by 0 days.

(21) Appl. No.: 15/810,209

(22) Filed: Nov. 13, 2017

(65) Prior Publication Data

US 2018/0138437 A1 May 17, 2018

(30) Foreign Application Priority Data

Nov. 17, 2016 (JP) .................................. 2016-223989

(51) Int. Cl.
*H01L 29/08* (2006.01)
*H01L 51/50* (2006.01)
*H01L 27/32* (2006.01)

(52) U.S. Cl.
CPC ...... *H01L 51/5012* (2013.01); *H01L 27/3237* (2013.01); *H01L 51/5024* (2013.01); *H01L 51/5092* (2013.01); *H01L 27/3244* (2013.01)

(58) Field of Classification Search
CPC ............. H01L 27/3237; H01L 27/3244; H01L 51/5092
USPC ............................................. 257/40, 59, 72
See application file for complete search history.

(56) References Cited

U.S. PATENT DOCUMENTS

| | | | |
|---|---|---|---|
| 8,618,559 B2 \* | 12/2013 | Hamaguchi | H01L 27/3218 257/40 |
| 2003/0076032 A1 | 4/2003 | Suzuri et al. | |
| 2009/0108741 A1 | 4/2009 | Yokoyama et al. | |
| 2011/0108812 A1 \* | 5/2011 | Sumita | H01L 27/3248 257/40 |

FOREIGN PATENT DOCUMENTS

| | | |
|---|---|---|
| JP | 2009-111023 A | 5/2009 |
| JP | 4281308 B2 | 6/2009 |

\* cited by examiner

*Primary Examiner* — Tan N Tran

(74) *Attorney, Agent, or Firm* — Michael Best & Friedrich LLP

(57) ABSTRACT

An electroluminescence display device includes a first pixel electrode; a second pixel electrode provided in the same layer as the first pixel electrode; a counter electrode provided on the first pixel electrode and the second pixel electrode; a first organic light emitting layer provided between the first pixel electrode and the counter electrode, the first organic light emitting layer emitting light having a first wavelength; and a second organic light emitting layer provided between the second pixel electrode and the counter electrode, the second organic light emitting layer emitting light having a second wavelength. The first light emitting layer contains a host material, a first dopant material and a first assist dopant material; and the second light emitting layer contains the host material, a second dopant material and a second assist dopant material.

9 Claims, 3 Drawing Sheets

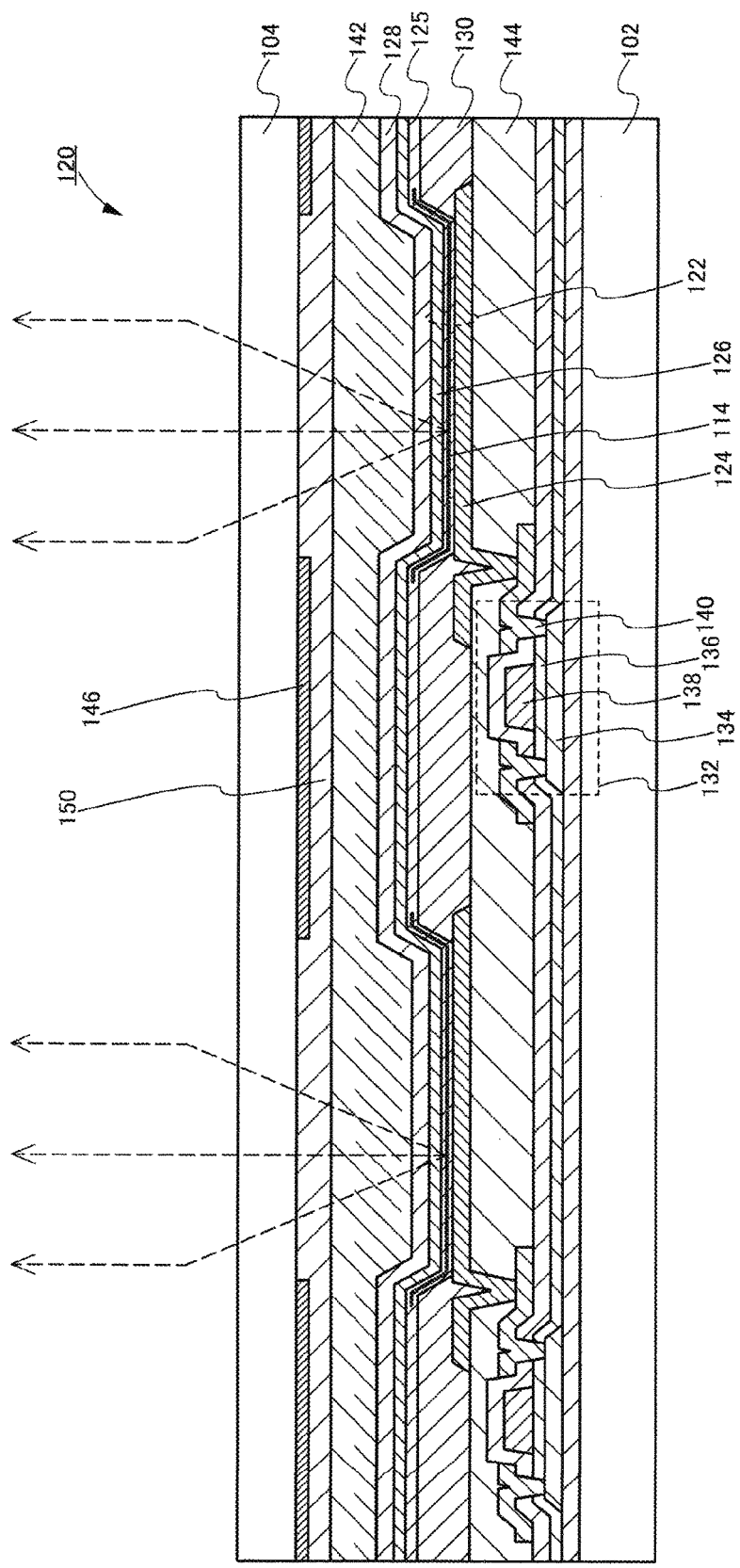

ORGANIC ELECTROLUMINESCENCE DISPLAY DEVICE

CROSS REFERENCE TO RELATED APPLICATIONS

This application is based upon and claims the benefit of priority from the prior Japanese Patent Application No. 2016-223989, filed on Nov. 17, 2016, the entire contents of which are incorporated herein by reference.

FIELD

The present invention relates to an organic electroluminescence display device (hereinafter, referred to as an "organic EL display device"), specifically, to an organic EL display device including a light emitting layer formed by a production method that is simplified and improves the productivity.

BACKGROUND

An organic electroluminescence element (hereinafter, also referred to as an organic EL element) includes a pair of electrodes and a thin film containing an organic electroluminescence material (hereinafter, also referred to as an "organic EL material") located between the pair of electrodes. Such an organic EL element emits light as follows. A singlet exciton, generated by recombination of a hole and an electron caused by a host molecule in the light emitting layer, causes energy transfer to a fluorescent molecule, which is a light emitting dopant. As a result, the fluorescent molecule emits light. The intensity of light emission of the organic EL element is controllable by the level of voltage to be applied or by the amount of electric current flowing in the element. A display device including a display screen that includes pixels formed by use of this characteristic has been developed.

A display device using an organic EL element is capable of displaying an image by controlling light emission of individual pixels independently. Therefore, the display device does not require a backlight unit, which is required in a transmission-type liquid crystal display device, and thus is made thinner. In the meantime, for producing such an organic EL display device, a combination of a dopant material and a host material suitable for the dopant material needs to be selected to form a light emitting layer for each of colors of light to be emitted. Therefore, a light emitting layer needs to be formed for each color of light to be emitted. Namely, different dopant materials and different assist dopant materials need to be provided in pixels corresponding to different colors. In the case of, for example, forming pixels of three colors of RGB, three dopant materials and three host materials suitable for the three dopant materials need to be prepared to form the pixels of the three colors.

For example, Japanese Laid-Open Patent Publication No. 2009-111023 describes the following. A single mixed layer containing a host material and at least three light emitting materials providing different colors of light is continuously formed in a display region. Pixels corresponding to each of the colors are irradiated with electromagnetic waves, so that the light emitting capability of the light emitting material that does not contribute to the color for the corresponding pixels is lost.

Japanese Patent No. 4281308 describes that one, same host material having a peak emission wavelength of 415 nm or shorter is used for all the light emitting layers and that an iridium complex is used as a dopant.

SUMMARY

An embodiment of the present invention provides an electroluminescence display device including a first pixel electrode; a second pixel electrode provided in the same layer as the first pixel electrode; a counter electrode provided on the first pixel electrode and the second pixel electrode; a first organic light emitting layer provided between the first pixel electrode and the counter electrode, the first organic light emitting layer emitting light having a first wavelength; and a second organic light emitting layer provided between the second pixel electrode and the counter electrode, the second organic light emitting layer emitting light having a second wavelength. The first light emitting layer contains a host material, a first dopant material and a first assist dopant material; and the second light emitting layer contains the host material, a second dopant material and a second assist dopant material.

BRIEF EXPLANATION OF THE DRAWINGS

FIG. 3 is a sectional view showing the arrangement of a pixel 120 in the pixel unit 106 according to an embodiment of the present invention.

DESCRIPTION OF EMBODIMENTS

Figure 1A:
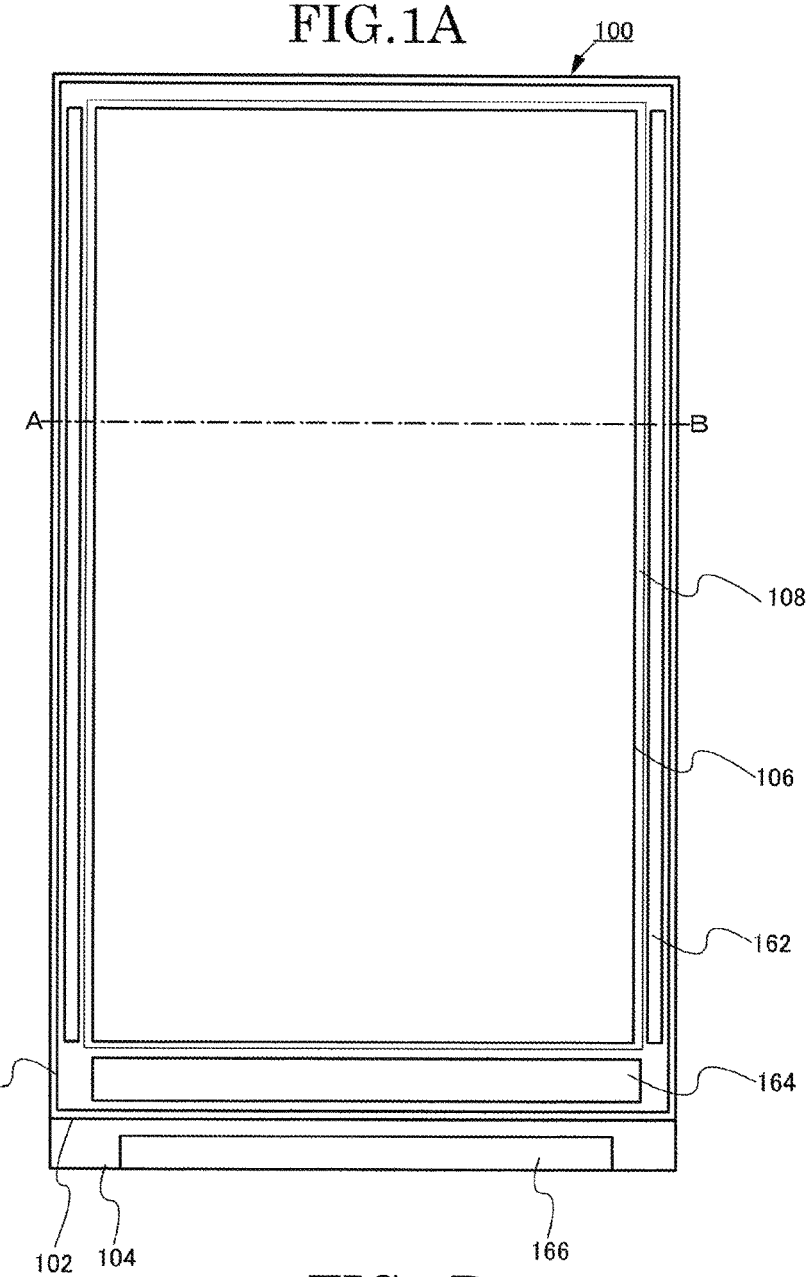
FIGS. 1A and 1B are, respectively, a plan view and a sectional view of an electroluminescence display device according to an embodiment of the present invention.

Embodiments of the present invention will be described below with reference to the accompanying drawings and the like. Note, however, that the present invention can be carried out in many different modes and should not be interpreted by only the written contents of embodiments exemplified below. In addition, for the sake of clearer explanation, the drawings sometimes show each portion more schematically than in actual modes in terms of width, thickness, shape, and the like. However, each drawing shows merely an example and should not limit the interpretation of the present invention. Furthermore, in this specification and the drawings, the same reference numerals denote the same elements as those described with reference to preceding drawings, and a detailed description will be appropriately omitted.

In this specification, a case in which a given member or region is located "on (or under)" another member or region includes not only a case in which a given member or region is located immediately above (or immediately below) another member or region but also a case in which a given member or region is located above (or below) another member of region, unless otherwise specified. That is, this case also includes a case in which another constituent element is located above (or below) another member or region so as to be included between a given member or region and another member or region.

In an organic EL display device that emits light merely by singlet excitons, singlet excitons generated by recombination of holes and electrons in a light emitting layer occupy 25% of all the excitons, and the remaining 75% of the excitons are triplet excitons. The triplet excitons do not contribute to light emission because of heat deactivation. By contrast, in an organic EL display device that emits light merely by triplet excitons, singlet excitons, which occupy 25% of all the excitons, do not contribute to light emission because of heat deactivation. Recently, a technology has been reported by which a triplet exciton is converted into a singlet exciton to dope the light emitting layer with a light emitting dopant and also an assist dopant capable of performing energy transfer of a singlet exciton to a fluorescent molecule. Theoretically, triplet excitons are mostly convertible into singlet excitons by use of the assist dopant. Therefore, a highly efficient organic EL display device is expected to be realized.

Although triplet excitons are mostly convertible into singlet excitons by use of the assist dopant theoretically, it is necessary to select a host material suitable for the dopant material and for the assist dopant material to form a pixel for each of colors of light to be emitted, to incorporate the assist dopant material into the light emitting layer. This complicates the production process of the organic EL display device, and thus decreases the productivity and increases the production cost of such organic EL display devices.

In light of these problems, the present invention has an object of providing an organic EL display device that including a light emitting layer formed by a production method that is simplified and improves the productivity.

<Structure of the Organic EL Display Device>

Figure 1B:
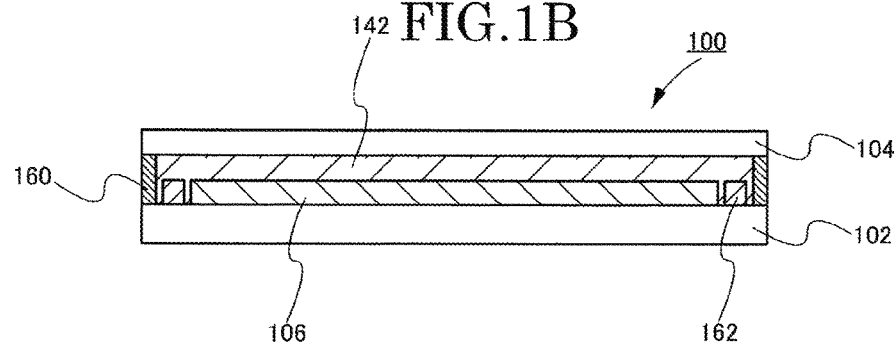

FIG. 1A and FIG. 1B show a structure of an organic EL display device 100 according to an embodiment of the present invention. FIG. 1A is a plan view of the organic EL display device 100. FIG. 1B shows a cross-sectional structure of the organic display device 100 taken along line A-B in FIG. 1A.

The organic EL display device 100 includes a first pixel electrode; a second pixel electrode provided in the same layer as the first pixel electrode; and a counter electrode provided on the first pixel electrode and the second pixel electrode. The organic EL display device 100 further includes a first organic light emitting layer provided between the first pixel electrode and the counter electrode, the first organic light emitting layer emitting light having a first wavelength; and a second organic light emitting layer provided between the second pixel electrode and the counter electrode, the second organic light emitting layer emitting light having a second wavelength.

In the organic EL display device 100, the first light emitting layer contains a host material, a first dopant material and a first assist dopant material. The second light emitting layer contains a host material, a second dopant material and a second assist dopant material. The host material contained in the first light emitting layer and the host material contained in the second light emitting layer are the same as each other.

With reference to FIG. 1A and FIG. 1B, the organic EL display device 100 includes a pixel unit 106 including a plurality of pixels 120 (see FIG. 3) arrayed two-dimensionally. The pixel unit 106 is provided on a first substrate 102. The first substrate 102 may have a scanning line driving circuit 162, a video signal line driving circuit 164, an input terminal portion 166 and the like provided thereon. A second substrate 104 faces the first substrate 102, and is provided so as to seal the pixel unit 106.

The second substrate 104 and the first substrate 102 are secured to each other by a sealing member 160. The second substrate 104 and the first substrate 102 are secured to each other while having a gap of several micrometers to several ten micrometers therebetween. The gap is filled with a filler member 142. The filling member 142 is preferably formed of a resin material. A structure in which the pixel unit 106 is located between the second substrate 104 and the first substrate 102, and the gap between the second substrate 104 and the first substrate 102 is filled with the filling member 142 is referred to as a "solid sealing structure". The second substrate 104 and the first substrate 102 may be secured to each other by the filling member 142, with no use of the sealing member 160. In the case where the pixel unit (display region) 106 is protected merely by the filling member 142 in a preferred manner, the second substrate 104 does not need to be provided.

The pixels 120 in the pixel unit 106 each include an organic EL element 122 (see FIG. 3). The organic EL element 122 includes an organic light emitting layer, which contains a host material provided as an organic EL material, and a dopant material and an assist dopant material that are suitable for the color of light to be emitted by the organic EL element 122. The same host material is contained in all the pixels 120. The pixels 120 in the pixel unit 106 are each controlled by a pixel circuit independently regarding light emission. A signal controlling the light emission of each pixel 120 is supplied by the scanning line driving circuit 162 and the video signal line driving circuit 164. In this specification, the light emitting dopant material may be referred to simply as the "dopant material".

The organic EL display device 100 shown in FIG. 1A and FIG. 1B is of a top emission structure, in which light emitted from the pixel unit 106 is output toward the second substrate 104.

In such a top emission-type organic EL display device, the second substrate 104 needs to be light-transmissive. Therefore, the second substrate 104 is formed of glass or a resin material. A highly light-transmissive resin material is preferably selected from the group consisting of, for example, polybenzoxazole, polyamideimide having an alicyclic structure, polyimide having an alicyclic structure, polyamide, and poly(p-xylylene). A single material selected from these resin materials may be used, or a combination of a plurality of materials among these resin materials may be used. In the case of being formed of a polyamide resin, the second substrate 104 may be formed as follows. A solution containing polyamic acid (encompassing partially imidized polyamic acid), which is a precursor of polyimide, or a solution containing soluble polyimide, is applied to a support substrate and sintered.

Figure 2:
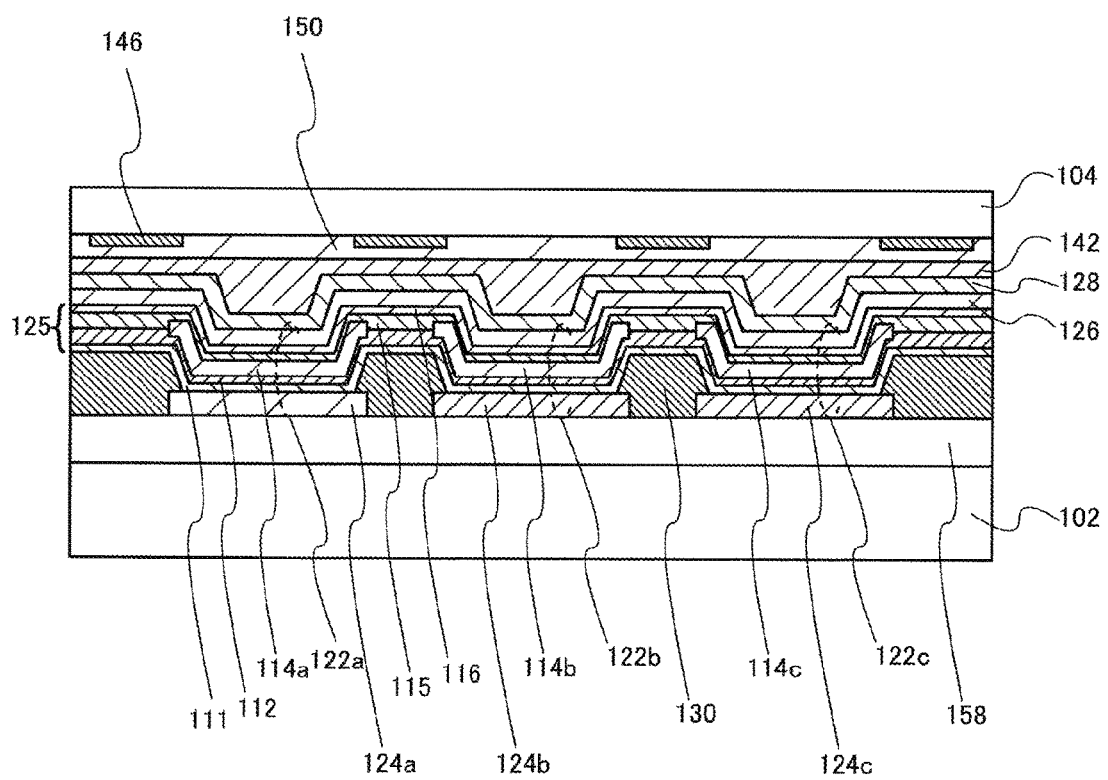
FIG. 2 is a sectional view showing the arrangement of an organic EL element 122 in a pixel unit 106 according to an embodiment of the present invention.

With reference to FIG. 2 and FIG. 3, a structure of the pixel unit 106 will be described. FIG. 2 is a sectional view showing the organic EL element 122 in the pixel unit 106. FIG. 3 is a sectional view showing a structure of the pixel 120 in the pixel unit 106. A first organic EL element 122a, a second organic EL element 122b and a third organic EL element 122c (hereinafter, each organic EL element will also be referred to as an "organic EL element 122" in the case where the organic EL element is not specifically distinguished as the first, second or third organic EL element) respectively include a first pixel electrode 124a, a second pixel electrode 124b and a third pixel electrode 124c located in the same layer (hereinafter, each pixel electrode will also be referred to as a "pixel electrode 124" in the case where the pixel electrode is not specifically distinguished as the first, second or third pixel electrode), an organic EL layer 125 and a counter electrode 126. The organic EL layer 125 is stacked on the pixel electrodes 124, and the counter electrode 126 is stacked on the organic EL layer 125. The organic EL layer 125 may be formed of a low molecular weight type organic material or a high molecular weight type organic material. In each organic EL element 122, the organic EL layer 125 includes a first organic light emitting layer 114a, a second organic light emitting layer 114b or a third organic light emitting layer 114c (hereinafter, each organic light emitting layer will also be referred to as an "organic light emitting layer 114" in the case where the organic light emitting layer is not specifically distinguished as the first, second or third organic light emitting layer). The first organic light emitting layer 114a, the second organic light emitting layer 114b and the third organic light emitting layer 114c each contain a host material common to all the pixels 120, and a dopant material and an assist dopant material suitable to the color of light emitted by the corresponding pixel 120. The organic EL layer 125 further includes carrier transfer layers such as a hole transfer layer 111, an electron transfer layer 116 and the like. The carrier transfer layers are located to have the organic light emitting layer 114 therebetween. An electron blocking layer 112 may be provided between the hole transfer layer 111 and the organic light emitting layer 114, and a hole blocking layer 115 may be provided between the electron transfer layer 116 and the organic light emitting layer 114.

The first organic light emitting layer 114a, the second organic light emitting layer 114b and the third organic light emitting layer 114c respectively emit light having a first wavelength, a second wavelength and a third wavelength that are different from each other. For example, the organic EL layer 125 may emit light of red (R), green (G) or blue (B), or may emit light of a different color, in each organic EL element 122. The first organic light emitting layer 114a, the second organic light emitting layer 114b and the third organic light emitting layer 114c are formed as follows. Melting pots each accommodating a host material, a light emitting dopant material or an assist dopant material as a vapor deposition source are prepared, and vapor co-deposition is performed for each color. According to the present invention, the host material is common to the first through third organic light emitting layers 144a through 144c, whereas the light emitting dopant material and the assist dopant material are prepared for each color. Therefore, seven melting pots in total are required; specifically, one melting pot for the host material, three melting pots for the light emitting dopant materials, and three melting pots for the assist dopant materials are required. As compared with a case where a host material is prepared for each of colors, the number of the required melting pots is decreased by two.

In an embodiment, the organic EL layer 125 may include a hole injection layer between the pixel electrode 124 and the hole transfer layer 111, and may also include an electron injection layer between the counter electrode 126 and the electron transfer layer 116.

In this embodiment, the hole transfer layer 111, the electron blocking layer 112, the organic light emitting layer 114, the hole blocking layer 115, the electron transfer layer 116, the hole injection layer and the electron injection layer may each be formed of a known material.

A hole transfer-type material usable for the hole transfer layer 111 and the hole injection layer is, for example, at least one selected from the group consisting of heterocyclic conjugated monomers, oligomers, polymers and the like such as benzidine or a derivative thereof, styrylamine or a derivative thereof, triphenylmethane or a derivative thereof, porphyrin or a derivative thereof, triazole or a derivative thereof, imidazole or a derivative thereof, oxadiazole or a derivative thereof, polyarylalkane or a derivative thereof, phenylenediamine or a derivative thereof, arylamine or a derivative thereof, oxazole or a derivative thereof, anthracene or a derivative thereof, fluorenone or a derivative thereof, hydrazone or a derivative thereof, stilbene or a derivative thereof, phthalocyanine or a derivative thereof, a polysilane-based compound, a vinylcarbazole-based compound, a thiophene-based compound, an aniline-based compound, and the like.

A specific example of such a hole transfer-type material may be, for example, at least one selected from the group consisting of α-nathtylphenyldiamine (αNPD), porphyrin, metal-tetraphenylporphyrin, metal-naphthalocyanine, 4,4',4"-trimethyltriphenylamine, 4,4',4"-tris(3-methylphenyl-phenylamino)triphenylamine (m-MTDATA), N, N, N',N'-tetrakis(p-tolyl)p-phenylenediamine, N,N,N',N'-tetraphenyl-4,4'-diaminobiphenyl, N-phenylcarbazole, 4-di-p-tolylaminostilbene, poly(paraphenylenevinylene), poly (thiophenevinylene), poly(2,2'-thienylpyrrol), and the like. The hole transfer-type material is not limited to any of the above.

A material usable for the electron blocking layer 112 may be, for example, HTEB02 or HTEB04 produced by Kanto Chemical Co., Inc.

An electron transfer-type material usable for the electron transfer layer 116 and the electron injection layer is, for example, at least one selected from the group consisting of 8-hydroxyquinolinealuminum (Alq3), 8-hydroxymethylquinolinealuminum, anthracene, naphthalene, phenanthrene, pyrene, chrysene, perylene, butadiene, coumarin, acridine, stilbene, derivatives thereof, and the like. The electron transfer-type material is not limited to any of the above.

A material usable for the hole blocking layer 115 may be, for example, 4,4'-N,N'-dicarbozole-biphenyl (CBP) or 2,9-dimethyl-4,7-diphenyl-1,10-phenanthroline (BCP).

The organic light emitting layer 114 is formed of a host material common to all the colors of light to be emitted, and a dopant material and an assist dopant material suitable for each of the colors to be emitted. For a conventional organic EL display device, it is needed to select a host material suitable for the dopant material and the assist dopant material and prepare a host material for each of pixels corresponding to each color of light to be emitted. This requires studies to be made on a combination of a dopant material and an assist dopant material with a host material. In addition, for forming the organic light emitting layer 114 by vapor deposition, it is necessary to prepare a melting pot for each host material and to perform vapor deposition for each host material. Therefore, the number of production steps of the organic EL display device is increased, which decreases the productivity and increases the production cost.

For producing the organic EL display device 100 according to the present invention, a common host material for all the colors is used; the dopant material and the assist dopant material suitable for each color are selected; and the host material, the dopant material and the assist dopant material are vapor co-deposited. Therefore, the number of the melting pots is decreased, and the production process of the organic EL display device 100 is simplified. Thus, the productivity is improved and the production cost is decreased.

A material usable for the pixel electrode 124 may be, for example, at least one selected from the group consisting of nickel, silver, gold, platinum, palladium, selenium, rhodium, ruthenium, iridium, rhenium, tungsten, molybdenum, chromium, tantalum, niobium, alloys thereof, tin oxide ($SnO_2$), indium tin oxide (ITO), zinc oxide, titanium oxide, and the like. The material usable for the pixel electrode 124 is not limited to any of the above. A material usable for the counter electrode 126 may be, for example, at least one selected from the group consisting of an alloy of an active metal material such as Li, Mg, Ca or the like and a metal material such as Ag, Al, In or the like, and a stack of such materials. A material usable for the counter electrode 126 is not limited to any of the above.

With reference to FIG. 3, the structure of the pixel 120 in the pixel unit 106 will be further described. The pixel 120 includes the organic EL element 122 and a transistor 132. A peripheral region of the pixel electrode 124 is covered with a bank layer 130, and the organic EL layer 125 is provided on a top surface of the pixel electrode 124 and continuously on a top surface of the bank layer 130. A region of the organic EL layer 125 that is located on the pixel electrode 124 corresponding to each color includes the organic light emitting layer 114, which is individually provided in each pixel 120. A sealing film 128 may be provided on a top surface of the organic EL element 122. The sealing film 128 is provided so as to cover substantially the entirety of the pixel unit 106.

In this embodiment, the organic EL display device 100, or the pixel 120, is of a top emission structure. Therefore, it is preferred that in the organic EL element 122, the counter electrode 126 is light-transmissive and the pixel electrode 124 has a light-reflective surface. The light emitted by the organic EL layer 125 radiates in all the directions, namely, 4π as represented by the solid angle. Therefore, the light radiating toward the second substrate 104 includes at least, in a mixed state, a light component directly radiating from the organic EL layer 125 and a light component reflected by the pixel electrode 124 and radiating toward the second substrate 104. Regardless of the type of light, the light emitted by the organic EL layer 125 is incident on the second substrate 104 at various angles.

The counter electrode 126 is supplied with a potential common to the plurality of pixels 120, and the level of the electric current flowing in the organic EL element 122 is controlled by the transistor 132. The value of the electric current flowing in the organic EL element 122 via the transistor 132 varies in accordance with the video signal, and the level of the electric current determines a potential difference between the counter electrode 126 and the pixel electrode 124.

The transistor 132 is a field effect transistor, in which a semiconductor layer 134 and a gate electrode 138 are insulated from each other by a gate insulating layer 136. Specifically, the transistor 132 is in the form of a thin film transistor, in which a channel is formed in the semiconductor layer 134, which is a thin film layer. It is preferred that an interlayer insulating layer 144 is provided between the transistor 132 and the organic EL element 122. The pixel electrode 124 is provided on the interlayer insulating layer 144, and is connected with a source/drain electrode 140 via a contact hole.

The organic EL display device 100 in this embodiment includes the optical element integrated with the sealing substrate (second substrate 104) on the side on which light from the pixel unit 106 is output (on the display screen side), so as to improve the light output efficiency while being decreased in the thickness.

<Host Material>

The host material usable for the organic EL display device 100 according to the present invention is required to have characteristics closely related with the light emitting dopant material and the assist dopant material determined for each of colors of light to be emitted. A parameter important for the host material is mainly energy level in an excited state. According to the present invention, the host material is required to have a T1 (triplet excited state) level that is 2.8 eV or greater and is greater by at least 4.0 eV than an S1 (singlet excited state) level of the assist dopant material (described below).

<Dopant>

The dopant material usable for the organic EL display device 100 according to the present invention is required to have an S1 level of 2.6 eV or greater and 3.0 eV or less for each of colors of light to be emitted. In an embodiment, the dopant material usable for the organic EL display device 100 according to the present invention may be, for example, 2,5,8,11-tetra-tert-butylperylene (TBPe) represented by chemical formula (1).

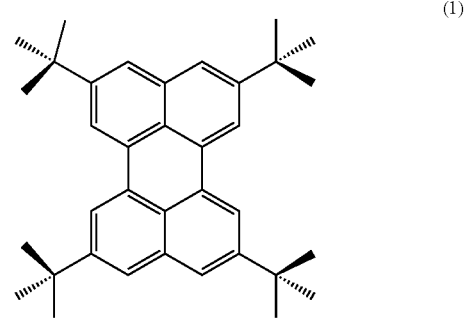

(1)

<Assist Dopant>

The assist dopant material usable for the organic EL display device 100 according to the present invention is required to have an S1 level of 2.4 eV or greater and 3.0 eV or less and REST (level gap between the singlet excited state and the triplet excited state) of 0 eV or greater and 0.2 eV or less for each of colors of light to be emitted. In an embodiment, the assist dopant material usable for the organic EL display device 100 according to the present invention may be, for example, ACRSA represented by chemical formula (2) or 2CzPN represented by chemical formula (3).

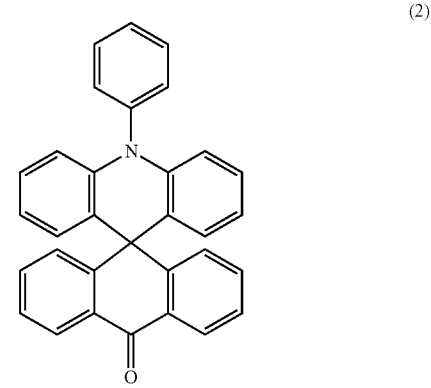

(2)

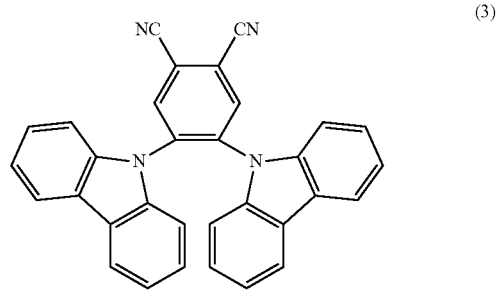

(3)

The dopant material and the assist dopant material usable for the organic EL display device 100 according to the present invention may be in a combined state. For example, a compound represented by chemical formula (4), in which TBPe and ACRSA are combined together, or a compound represented by chemical formula (5), in which TBPe and 2CzPN are combined together, are usable.

The combined state of the compound of chemical formula (1) (TBPe) and the compound of chemical formula (2) (ACRSA) may be represented by, for example, chemical formula (4) in the case where TBPe and ACRSA are coupled with each other by a single bond. The combined state is not limited to this.

(4)

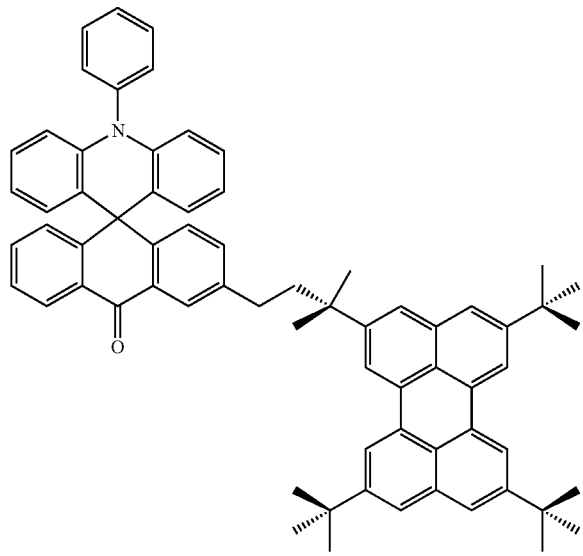

The combined state of the compound of chemical formula (1) (TBPe) and the compound of chemical formula (3) (2CzPN) may be represented by, for example, chemical formula (5) in the case where TBPe and 2CzPN are coupled with each other by a single bond. The combined state is not limited to this.

(5)

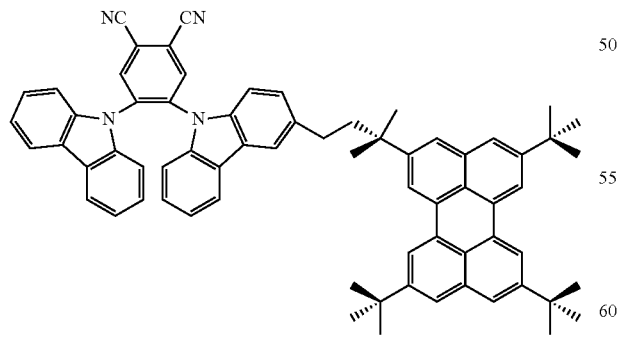

For producing the organic EL display device 100 according to the present invention, a common host material is used; the dopant material and the assist dopant material suitable for each color are selected; and the host material, the dopant material and the assist dopant material are vapor co-deposited. Therefore, the number of the melting pots is decreased, and the production process of the organic EL display device 100 is simplified. Thus, the productivity is improved and the production cost is decreased.

<Production Method>

A method for producing components of an organic EL display device 100 according to an embodiment of the present invention will be described. The components of the organic EL display device 100 may be produced by a known method.

First, the pixel circuit is formed on the first substrate 102. In this step, the scanning line driving circuit, the video signal line driving circuit, the input terminal portion and the like are optionally formed. Components included in the pixel circuit, for example, the transistor 132, a capacitor and the like are formed by repeating a step of stacking thin films of a semiconductor material, an insulating material and a metal material and a step of patterning by use of photolithography.

On a circuit element layer 158 (see FIG. 3) including the pixel circuit and the like, the organic EL element 122 is formed. For forming the organic EL element 122 in each pixel 120, the pixel electrode 124 electrically connected with the pixel circuit is formed. The pixel electrode 124 is formed on the interlayer insulating layer 144, which buries the transistor 132. Next, the bank layer 130 covering the peripheral region of the pixel electrode 124 is formed. The pixel electrode 124 is formed for each pixel 120 and is surrounded by the bank layer 130. Thus, the area of each pixel 120 is defined.

The hole transfer layer 111, the electron blocking layer 112, the organic light emitting layer 114, the hole blocking layer 115 and the electron transfer layer 116 are formed on the pixel electrode 124. These layers may be formed by vapor deposition or by printing by use of ink-jetting. In an embodiment, the hole injection layer may be formed between the pixel electrode 124 and the hole transfer layer 111, and the electron injection layer may be formed between the counter electrode 126 and the electron transfer layer 116. As a result, the organic EL layer 125 is formed.

The organic light emitting layer 114 may be formed by vapor co-deposition of three components, namely, the above-described host material according to the present invention and also the dopant material and the assist dopant material, such that these components are provided in positional correspondence with the corresponding pixel. These materials may be applied for each pixel by printing by use of ink-jetting.

Then, the counter electrode 126 is formed. On a top surface of the counter electrode 126, the sealing film 128 is formed of a silicon nitride film or the like. In this manner, the pixel circuit and the pixel unit 106 are formed.

What is claimed is:

1. An electroluminescence display device, comprising:
   a first pixel electrode;
   a second pixel electrode provided in the same layer as the first pixel electrode;
   a counter electrode provided on the first pixel electrode and the second pixel electrode;
   a first organic light emitting layer provided between the first pixel electrode and the counter electrode, the first organic light emitting layer emitting light having a first wavelength;
   a second organic light emitting layer provided between the second pixel electrode and the counter electrode, the second organic light emitting layer emitting light having a second wavelength;

an electron blocking layer between the first pixel electrode and the first organic light emitting layer and between the second pixel electrode and the second organic light emitting layer; and a hole blocking layer between the first organic light emitting layer and the counter electrode and between the second organic light emitting layer and the counter electrode, wherein the first organic light emitting layer contains a host material, a first dopant material and a first assist dopant material, the second organic light emitting layer contains the host material that is the same as that of the first organic light emitting layer, a second dopant material and a second assist dopant material, each of the first organic light emitting layer and the second organic light emitting layer is encapsulated by the electron blocking layer and the hole blocking layer, and the electron blocking layer and the hole blocking layer are in contact with each other at a region between the first organic light emitting layer and the second organic light emitting layer.

2. The electroluminescence display device according to claim 1, wherein the host material has a T1 level of 2.8 eV or greater, the T1 level of the host material being greater by at least 0.4 eV than an S1 level of the first and second assist dopant materials.

3. The electroluminescence display device according to claim 1, wherein the first dopant material and the second dopant material each have an S1 level of 2.6 eV or greater and 3.0 eV or less.

4. The electroluminescence display device according to claim 1, wherein the first assist dopant material and the second assist dopant material each have an S1 level of 2.4 eV or greater and 3.0 eV or less, and the first assist dopant material and the second assist dopant material each have REST of 0 eV or greater and 0.2 eV or less.

5. The electroluminescence display device according to claim 1, further comprising:

a third pixel electrode provided in the same layer as the first pixel electrode and the second pixel electrode; and a third organic light emitting layer provided between the third pixel electrode and the counter electrode, the third organic light emitting layer emitting light having a third wavelength, wherein the third organic light emitting layer contains the host material that is the same as that of the first organic light emitting layer and that of the second organic light emitting layer, a third dopant material and a third assist dopant material.

6. The electroluminescence display device according to claim 5, wherein the third dopant material has an S1 level of 2.6 eV or greater and 3.0 eV or less.

7. The electroluminescence display device according to claim 5, wherein the third assist dopant material has an S1 level of 2.4 eV or greater and 3.0 eV or less; and the third assist dopant material has REST of 0 eV or greater and 0.2 eV or less.

8. The electroluminescence display device according to claim 5, wherein the electron blocking layer is also provided between the third pixel electrode and the third organic light emitting layer; and the hole blocking layer is also provided between the third organic light emitting layer and the counter electrode.

9. The electroluminescence display device according to claim 8, wherein the third organic light emitting layer is encapsulated by the electron blocking layer and the hole blocking layer, and the electron blocking layer and the hole blocking layer are in contact with each other at a region between the second organic light emitting layer and the third organic light emitting layer.

* * * * *